United States Patent
Imhof et al.

(10) Patent No.: US 11,346,877 B2
(45) Date of Patent: May 31, 2022

(54) VECTOR-SENSITIVE ELECTROMETER

(71) Applicants: Eric A. Imhof, Calabasas, CA (US); Michael S. Larsen, Woodland Hills, CA (US)

(72) Inventors: Eric A. Imhof, Calabasas, CA (US); Michael S. Larsen, Woodland Hills, CA (US)

(73) Assignee: NORTHROP GRUMMAN SYSTEMS CORPORATION, Falls Church, VA (US)

(*) Notice: Subject to any disclaimer, the term of this patent is extended or adjusted under 35 U.S.C. 154(b) by 0 days.

(21) Appl. No.: 17/005,399

(22) Filed: Aug. 28, 2020

(65) Prior Publication Data

US 2021/0270882 A1 Sep. 2, 2021

Related U.S. Application Data

(60) Provisional application No. 62/894,119, filed on Aug. 30, 2019.

(51) Int. Cl.
*G01R 29/08* (2006.01)

(52) U.S. Cl.
CPC ..... *G01R 29/0885* (2013.01); *G01R 29/0892* (2013.01)

(58) Field of Classification Search
CPC ............... G01R 29/0885; G01R 29/0892
USPC .......................................................... 324/97
See application file for complete search history.

(56) References Cited

U.S. PATENT DOCUMENTS

| 2014/0184216 A1* | 7/2014 | Walker ............... G01R 33/26 324/305 |
| 2015/0042327 A1 | 2/2015 | Bulatowicz |
| 2015/0241217 A1* | 8/2015 | Bulatowicz ........... G01C 19/62 324/309 |

(Continued)

FOREIGN PATENT DOCUMENTS

EP  2910900 A1 * 8/2015 ............. G01C 19/62

OTHER PUBLICATIONS

Kim, Kiwoong, et al. "Atomic vector gradiometer system using cesium vapor cells for magnetocardiography: perspective on practical application." IEEE Transactions on Instrumentation and Measurement 56.2 (2007): 458-462. (Year: 2007).*

(Continued)

*Primary Examiner* — Christopher P McAndrew
(74) *Attorney, Agent, or Firm* — Tarolli, Sundheim, Covell & Tummino LLP

(57) ABSTRACT

One embodiment includes an electrometer system that includes a sensor cell and a probe laser to generate a probe beam directed through the sensor cell in a first direction and exiting the sensor cell as a detection beam. The system also includes a coupling laser to generate a coupling beam directed through the sensor cell collinearly and anti-parallel with the probe beam. The system also includes a reference signal generator configured to generate a reference signal having a predetermined polarization and a predetermined frequency through the sensor cell. The system further includes a detection system configured to monitor the detection beam to determine a frequency and a vector component of an external signal based on an intensity of the detection beam and based on the predetermined polarization and the predetermined frequency of the reference signal.

20 Claims, 4 Drawing Sheets

(56) References Cited

U.S. PATENT DOCUMENTS

| | | | |
|---|---|---|---|
| 2016/0202062 A1 | 7/2016 | Griffith | |
| 2016/0202083 A1 | 7/2016 | Bulatowicz et al. | |
| 2016/0231395 A1* | 8/2016 | Foley | H05K 1/0212 |
| 2016/0363617 A1* | 12/2016 | Anderson | G01R 29/0885 |
| 2018/0372813 A1* | 12/2018 | Bulatowicz | G01R 33/0041 |
| 2019/0101611 A1 | 4/2019 | Bulatowicz et al. | |

OTHER PUBLICATIONS

International Search Report and Written Opinion for corresponding PCT/US2020/048325 dated May 31, 2021.

* cited by examiner

VECTOR-SENSITIVE ELECTROMETER

CROSS REFERENCE TO RELATED APPLICATION

This application claims priority from U.S. Provisional Patent Application No. 62/894,119, filed 30 Aug. 2019, which is incorporated herein by reference in its entirety.

TECHNICAL FIELD

The present invention relates generally to sensor systems, and specifically to a vector-sensitive electrometer.

BACKGROUND

Electric field measurement via electrometers has many useful applications. Detectable electric fields can include DC electric fields, as well as AC electric fields (e.g., radio frequency (RF) fields which can correspond to communications signals). The detection of electric fields can be implemented for anti-spoofing and and/or anti-jamming capability in electronic warfare environments. For example, if a jamming or spoofing signal can be detected, then the jamming signal or spoofing signal can be filtered or demodulated out to provide for a baseband signal of interest without undesired or adversarial interference. As an example, multiple antennas arranged in an array can provide for directional detection of a signal, such as to provide a detectable directional of a source of the signal.

SUMMARY

One example includes an electrometer system that includes a sensor cell and a probe laser to generate a probe beam directed through the sensor cell in a first direction and exiting the sensor cell as a detection beam. The system also includes a coupling laser to generate a coupling beam directed through the sensor cell collinearly and anti-parallel with the probe beam. The system also includes a reference signal generator configured to generate a reference signal having a predetermined polarization and a predetermined frequency through the sensor cell. The system further includes a detection system configured to monitor the detection beam to determine signal characteristics of an external signal based on an intensity of the detection beam and based on the predetermined polarization and the predetermined frequency of the reference signal.

Another example includes a method for detecting an external signal via an electrometer system. The method includes directing a probe beam through a sensor cell comprising an alkali metal vapor in a first direction, directing a coupling beam through the sensor cell collinearly and anti-parallel with the probe beam, and directing a reference signal having a predetermined polarization and a predetermined frequency through the sensor cell. The method also includes monitoring a detection beam corresponding to the probe beam exiting the sensor cell to ascertain a beat frequency that is associated with a difference between the predetermined frequency and the frequency of the external signal. The method further includes determining at least one of a frequency, an amplitude, and a polarization of the external signal based on the beat frequency.

Another example includes electrometer system that includes a sensor cell and a probe laser to generate a probe beam directed through the sensor cell in a first direction and exiting the sensor cell as a detection beam. The system also includes a coupling laser to generate a coupling beam directed through the sensor cell collinearly and anti-parallel with the probe beam. The system also includes optics configured to provide the probe beam and the coupling beam to be collinear and anti-parallel with respect to each other and to focus each of the probe beam and the coupling beam to a measurement point within the sensor cell. The system also includes a reference signal generator configured to generate a reference signal having a predetermined polarization and a predetermined frequency through the sensor cell. The system further includes a detection system configured to monitor the detection beam to determine signal characteristics of an external signal at the measurement point based on an intensity of the detection beam and based on the predetermined polarization and the predetermined frequency of the reference signal.

DETAILED DESCRIPTION

The present invention relates generally to sensor systems, and specifically to a vector-sensitive electrometer. The electrometer system can include a sensor cell containing an alkali metal vapor enclosed within. The electrometer system also includes a probe laser and a coupling laser that are configured to generate a probe beam and a coupling beam, respectively. Each of the probe beam and the coupling beam can be provided through the sensor cell via a set of optics, such that the probe beam and the coupling beam can be arranged collinearly and anti-parallel with each other, such that the probe beam exiting the sensor cell can correspond to a detection beam. For example, the probe beam and the coupling beam can be tuned to respective frequencies to provide a Rydberg transition of the alkali metal vapor.

The electrometer system also includes a reference signal generator configured to generate a reference signal having a predetermined frequency and a predetermined polarization through the sensor cell. As an example, the reference signal generator can provide each of a plurality of reference signals that are linearly orthogonally polarized and each have respective separate frequencies. The electrometer system further includes a detection system configured to monitor the detection beam to determine the signal characteristics of the external signal. As an example, the signal characteristics can include at least one of frequency, phase, magnitude, polarization, and a vector component of the electric field of the external signal. The external signal and the reference signals can, for example, be radio frequency (RF) signals, but can also occupy other portions of the electromagnetic frequency spectrum. For example, the detection beam can monitor a beat frequency associated with a difference between the predetermined frequency of the reference signal and a frequency of the external signal to determine the magnitude of the electric field vector of the external signal in the direction of the linear polarization of the reference signal. As an example, each of a plurality of reference signals can have different respective frequencies, such that the beat frequencies along each of the orthogonal polarization axes can be monitored to determine orthogonal vector components of the external signal, which can be determinative of a source of the external signal, such as based on tensor measurements along multiple measurement axes within the sensor cell.

Figure 1:
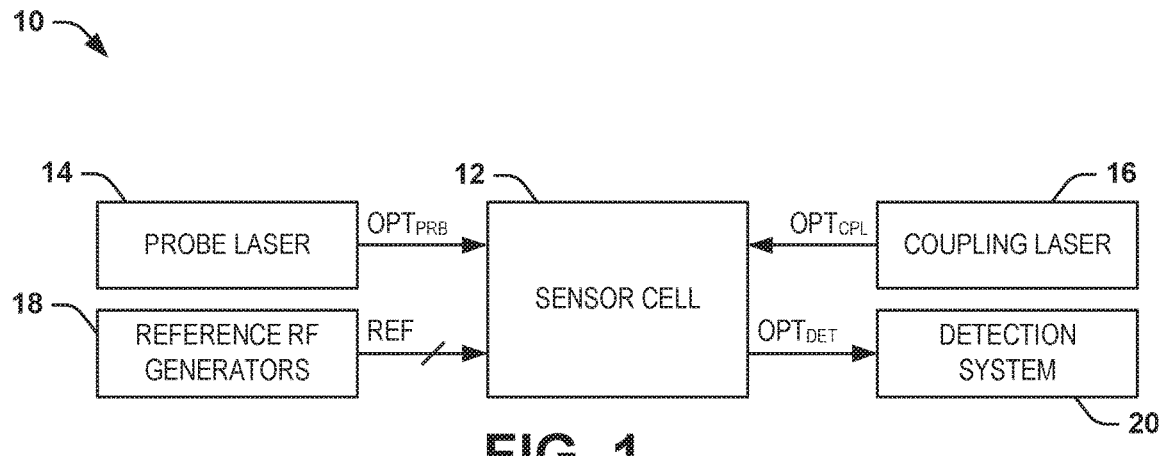
FIG. 1 illustrates an example diagram of an electrometer system.

FIG. 1 illustrates an example diagram of an electrometer system 10. The electrometer system 10 can be implemented in any of a variety of applications, such as to determine a source of an adversarial external electromagnetic signal that is provided in an electronic warfare environment. For example, the external signal can be a spoofing or jamming signal. Therefore, the electrometer system 10 can be implemented to determine a directional source of the external signal to provide an appropriate countermeasure.

The electrometer system 10 includes a sensor cell 12 that can be configured as a sealed glass container that includes an alkali metal vapor. As an example, the alkali metal vapor can be rubidium (Rb), or any of a variety of other types of alkali metals (e.g., cesium (Cs)). As described herein, the alkali metal vapor can be excited to a Rydberg state, such that the alkali metal vapor can be substantially insensitive to absorption of photons of light of a specific frequency (e.g., is approximately transparent). The electrometer system 10 also includes a probe laser 14 that is configured to generate a probe beam $OPT_{PRB}$ and a coupling laser 16 that is configured to generate a coupling beam $OPT_{CPL}$. Each of the probe beam $OPT_{PRB}$ and the coupling beam $OPT_{CPL}$ can be provided through the sensor cell 12 via optics (not shown) in a manner such that the probe beam $OPT_{PRB}$ and the coupling beam $OPT_{CPL}$ can each be collimated (e.g., via optics) and provided collinearly and anti-parallel with respect to each other. As an example, the probe beam $OPT_{PRB}$ and the coupling beam $OPT_{CPL}$ can be tuned to respective frequencies to provide the Rydberg transition of the alkali metal vapor. Therefore, the collimated and collinear probe beam $OPT_{PRB}$ and coupling beam $OPT_{CPL}$ can be provided to facilitate the Rydberg transition of the alkali metal vapor along an axis that extends through the sensor cell 12 to substantially maximize detection of the Rydberg transition. Alternatively, the probe beam $OPT_{PRB}$ and the coupling beam $OPT_{CPL}$ can each be focused (e.g., via optics) to measure the Rydberg transition at a point within the sensor cell 12. The probe beam $OPT_{PRB}$ can exit the sensor cell 12 as a detection beam $OPT_{DET}$.

The electrometer system 10 also includes at least one reference signal generator 18 that is configured to generate a respective at least one reference signal REF. The reference signal(s) REF can each be provided at a predetermined unique frequency with respect to each other and at a predetermined linear polarization. For example, the reference signal(s) REF can include a first reference signal $REF_X$ that is linearly polarized along an X-axis and has a first frequency, a second reference signal $REF_Y$ that is linearly polarized along a Y-axis and has a second frequency, and a third reference signal $REF_Z$ that is linearly polarized along a Z-axis and has a third frequency. As a result, the reference signals $REF_X$, $REF_Y$, and $REF_Z$ can be linearly polarized along respective orthogonal axes and can have three separate frequencies.

The electrometer system 10 further includes a detection system 20 that is configured to monitor the detection beam $OPT_{DET}$ to determine characteristics of the external signal. As an example, the characteristics of the external signal can include a frequency and a vector component of the external signal, as well as a phase and a magnitude of the external signal. For example, because the detection beam $OPT_{DET}$ can have an intensity that can change based on the external signal and based on the predetermined frequency of the reference signal(s) REF, the detection system 20 can monitor the intensity of the detection beam $OPT_{DET}$ to generate electric signals that are associated with the frequency and vector components of the external signal. For example, the detection system 20 can be configured to monitor at least one beat frequency that corresponds to a difference between the frequency of the external signal and the predetermined frequency of each of the respective reference signal(s) REF. Therefore, because the beat frequencies can be associated with the predetermined frequency of the reference signal(s) REF along a predetermined vector component, the vector component(s) of the external signal can be determined by the detection system 20. As a result of determining the vector component(s) of the external signal, the direction of the external signal can be determined by the detection system.

Figure 2:
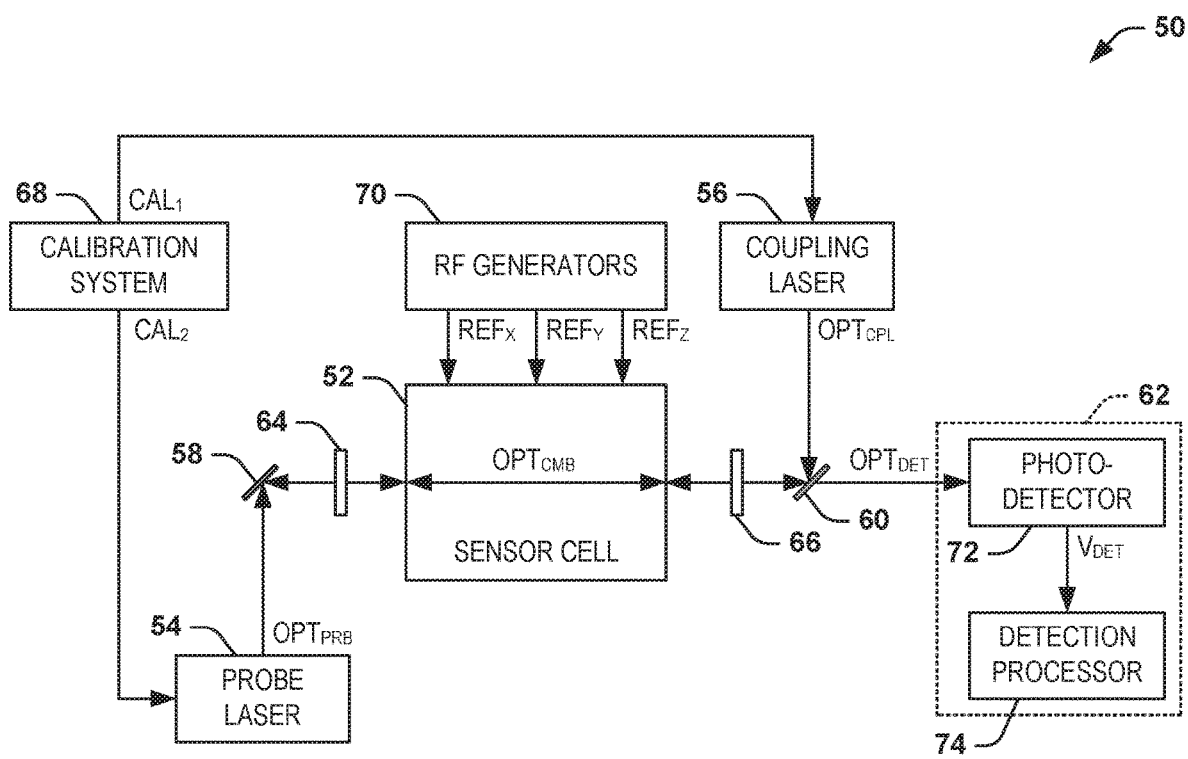
FIG. 2 illustrates another example diagram of an electrometer system.

FIG. 2 illustrates another example diagram of an electrometer system 50. The electrometer system 50 can be implemented in any of a variety of applications, such as to determine a source of an adversarial external signal that is provided in an electronic warfare environment. For example, the external signal can be a spoofing or jamming signal. Therefore, the electrometer system 50 can be implemented to determine a directional source of the external signal to provide an appropriate countermeasure.

The electrometer system 50 includes a sensor cell 52 that can be configured as a sealed glass container that includes an alkali metal vapor. The electrometer system 50 also includes a probe laser 54 that is configured to generate a probe beam $OPT_{PRB}$ and a coupling laser 56 that is configured to generate a coupling beam $OPT_{CPL}$. The probe beam $OPT_{PRB}$ is provided to a beamsplitter 58 (e.g., polarization beamsplitter) that is configured to reflect the probe beam $OPT_{PRB}$ into the sensor cell 52. Similarly, the coupling beam $OPT_{CPL}$ is provided to a beamsplitter 60 (e.g., polarization beamsplitter) that is configured to reflect the coupling beam $OPT_{CPL}$ into the sensor cell 52 and to pass the probe beam $OPT_{PRB}$ through it as a detection beam $OPT_{DET}$ that is monitored by a detection system 62. Similarly, the beamsplitter 58 is configured to pass the coupling beam $OPT_{CPL}$. As described in greater detail herein, the probe beam $OPT_{PRB}$ and the coupling beam $OPT_{CPL}$ can be tuned to respective frequencies to provide the Rydberg transition of the alkali metal vapor.

Based on the arrangement of the beamsplitters 58 and 60, the probe beam $OPT_{PRB}$ and the coupling beam $OPT_{CPL}$ can be provided through the sensor cell 52 in a manner such that the probe beam $OPT_{PRB}$ and the coupling beam $OPT_{CPL}$ are collinear and anti-parallel with respect to each other through the sensor cell 52, demonstrated in the example of FIG. 2 as a beam $OPT_{CMB}$. Additionally, the electrometer system 50 includes collimating optics 64 (e.g., a lens) that can collimate the probe beam $OPT_{PRB}$ along a specific axis in the sensor cell 52, and collimating optics 66 (e.g., a lens) that can collimate the coupling beam $OPT_{CPL}$ along the specific axis in the sensor cell 52, such that the collimation of each of the probe beam $OPT_{PRB}$ and the coupling beam $OPT_{CPL}$ can be provided along the same axis in a collinear and anti-parallel manner. Alternatively, the electrometer system 50 can include focusing optics to focus each of the probe beam $OPT_{PRB}$ and the coupling beam $OPT_{CPL}$ to be collocated in the sensor cell 52 at a measurement point.

In the example of FIG. 2, the electrometer system 50 also includes a calibration system 68 that is configured to tune the frequencies of the probe beam $OPT_{PRB}$ and the coupling beam $OPT_{CPL}$ to respective frequencies to provide a Rydberg transition of the alkali metal vapor. As an example, the calibration system 68 can implement a calibration procedure to set the frequencies of the probe beam $OPT_{PRB}$ and the coupling beam $OPT_{CPL}$. The calibration procedure can be described in greater detail with respect to the examples of FIGS. 4 and 5.

Figure 3:
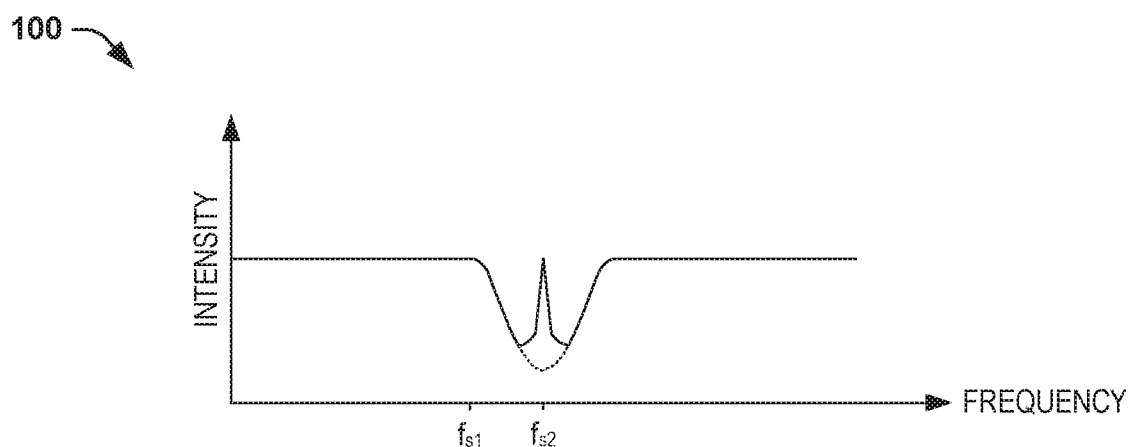
FIG. 3 illustrates an example graph of optical detection.
Figure 4:
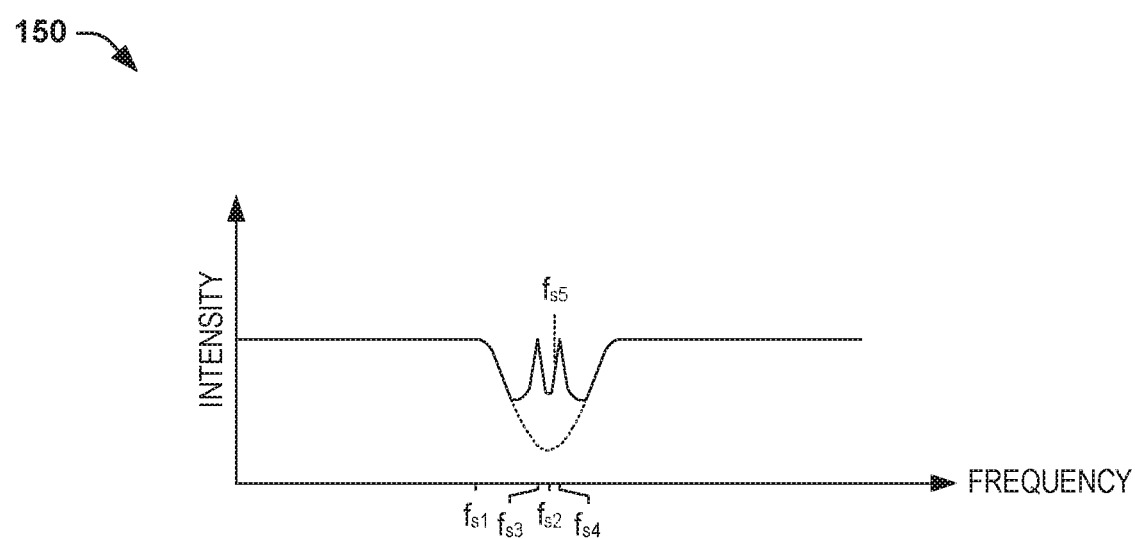
FIG. 4 illustrates another example graph of optical detection.

FIGS. 3 and 4 illustrate example graphs of optical detection. FIG. 3 illustrates an example graph 100 and FIG. 4 illustrates an example graph 150. The graphs 100 and 150 each demonstrate intensity of the detection beam $OPT_{DET}$ plotted as a function of frequency. For example, FIG. 3 can illustrate a first example of absorption of photons of the probe beam $OPT_{PRB}$, as indicated by the detection beam $OPT_{DET}$, when no reference signal or external signal is present. However, FIG. 4 can illustrate a second example of absorption of photons of the probe beam $OPT_{PRB}$, as indicated by the detection beam $OPT_{DET}$, in the presence of an external signal.

The graph 100 demonstrates an intensity of approximately 100% of the intensity of the detection beam $OPT_{DET}$, and thus substantially no absorption of photons of the probe beam $OPT_{PRB}$ by the alkali metal vapor. The intensity begins to decrease at a frequency $f_{s1}$ to an absorption peak at a frequency $f_{s2}$ corresponding to maximum absorption of the photons of the probe beam $OPT_{PRB}$ by the alkali metal vapor, and thus a minimum intensity of the detection beam $OPT_{DET}$. The minimum intensity is demonstrated at an inverse peak dotted line in the example of FIG. 3, which would correspond to maximum absorption of the photons of the probe beam $OPT_{PRB}$ absent the coupling beam $OPT_{CPL}$. However, due to the collinear anti-parallel coupling beam $OPT_{CPL}$, provided at a specific frequency and/or polarization with respect to the frequency of the probe beam $OPT_{PRB}$, the alkali metal vapor can experience a Rydberg transition, such that the alkali metal vapor can be substantially insensitive to absorption of the photons of the probe beam $OPT_{PRB}$ at the maximum absorption frequency $f_{s2}$. Therefore, the graph 100 demonstrates an intensity peak at the maximum absorption frequency $f_{s2}$. The detection system 62 can thus monitor the changes in the intensity peak at approximately the frequency $f_{s2}$ that can result from the external signal and the reference signal(s) REF.

Similarly, the graph 150 demonstrates an intensity of approximately 100% of the intensity of the detection beam $OPT_{DET}$, and thus substantially no absorption of photons of the probe beam $OPT_{PRB}$ by the alkali metal vapor. The intensity begins to decrease at a frequency $f_{s1}$ to an absorption peak at a frequency $f_{s2}$ corresponding to maximum absorption of the photons of the probe beam $OPT_{PRB}$ by the alkali metal vapor, and thus a minimum intensity of the detection beam $OPT_{DET}$. The minimum intensity is demonstrated at an inverse peak dotted line in the example of FIG. 4, which would correspond to maximum absorption of the photons of the probe beam $OPT_{PRB}$ absent the coupling beam $OPT_{CPL}$. However, based on the interaction of the alkali metal vapor with potentially three photons (e.g., from the probe beam $OPT_{PRB}$ and the coupling beam $OPT_{CPL}$, as well as from a third source of electromagnetic radiation such as the reference or external signal), the alkali metal vapor can exhibit transitions between Rydberg states. Therefore, the alkali metal vapor can be substantially insensitive to absorption of the photons of the probe beam $OPT_{PRB}$ at each of two frequencies $f_{s3}$ and $f_{s4}$ that are approximately equal and opposite the maximum absorption frequency $f_{s2}$ on the frequency spectrum.

For example, the electric field represented by the graph 150 can be expressed as follows:

$$|\vec{E}| = \frac{h}{p}\Delta f \quad \text{Equation 1}$$

Where: h is Planck's constant;
p is the dipole moment of the transition between the Rydberg states caused by the reference and/or external photon(s); and
$\Delta f$ is the measured frequency splitting of the frequencies $f_{s3}$ and $f_{s4}$.

Therefore, the graph 150 demonstrates intensity peaks at the frequencies $f_{s3}$ and $f_{s4}$. The detection system 62 can thus monitor the changes in one of the intensity peaks $f_{s3}$ and $f_{s4}$, or at an offset frequency along the slope of one of the peaks (e.g., an offset frequency $f_{s5}$), that can result from the external signal and the reference signal(s) REF.

Referring back to the example of FIG. 2, as an example, the calibration system 68 can be configured to calibrate the frequencies of the probe beam $OPT_{PRB}$ and the coupling beam $OPT_{CPL}$. In the example of FIG. 2, the calibration system 68 provides a control signal $CAL_1$ to the probe laser 54 and a control signal $CAL_2$ to the coupling laser 56 to control the frequencies of the respective probe beam $OPT_{PRB}$ and coupling beam $OPT_{CPL}$. For example, the calibration system 68 can be configured to sweep the frequency of the probe beam $OPT_{PRB}$ from a first predetermined frequency to a second predetermined frequency via the control signal $CAL_1$ to provide the frequency spectrum of one of the graphs 100 and 150. The absorption spectrum can thus be monitored by the detection system 62 to determine the absorption peak at the frequency $f_{s2}$. While it is described herein that the calibration system 68 sweeps the frequency of the probe beam $OPT_{PRB}$, it is likewise also possible to instead sweep the frequency of the coupling beam $OPT_{CPL}$.

The calibration system 68 can thus set the frequency of the probe beam $OPT_{PRB}$ to the frequency $f_{s2}$ after sweeping the frequency to determine the maximum absorption peak at the frequency $f_{s2}$. Upon determining the frequency $f_{s2}$, the calibration controller 68 can thus set the frequency of the coupling beam $OPT_{CPL}$ to an appropriate complementary frequency based on the known frequency $f_{s2}$ and the known absorption characteristics of the alkali metal vapor (e.g., likewise based on polarization characteristics of the probe beam $OPT_{PRB}$ and the coupling beam $OPT_{CPL}$) to stimulate the alkali metal vapor to the Rydberg state, and thus to provide the intensity peak at the frequency $f_{s2}$ in the graph 100. The detection system 62 can thus begin monitoring the frequency $f_{s2}$ or the frequency $f_{s5}$ (e.g., depending on an identified intensity spectrum based on the amplitude of the external signal) to determine the characteristics of the external signal, as described herein.

In the example of FIG. 2, the electrometer system 50 also includes a set of reference signal generators, demonstrated collectively at 70, that are configured to generate a set of reference signals $REF_X$, $REF_Y$, and $REF_Z$ that are provided through the sensor cell 52. Each of the reference signals $REF_X$, $REF_Y$, and $REF_Z$ can be provided at separate predetermined unique frequencies with respect to each other. Additionally, each of the reference signals $REF_X$, $REF_Y$, and $REF_Z$ are provided at respective orthogonal linear polarizations. For example, the first reference signal $REF_X$ is linearly polarized along an X-axis and has a first frequency, the second reference signal $REF_Y$ is linearly polarized along a Y-axis and has a second frequency, and the third reference signal $REF_Z$ is linearly polarized along a Z-axis and has a third frequency.

Similar to as described previously, the detection system 62 is configured to monitor the detection beam $OPT_{DET}$ to determine a frequency and vector components of the external signal. In the example of FIG. 2, the detection system 62 includes a photodetector 72 (e.g., a photodiode) and a detection processor 74. The photodetector 72 can monitor the intensity of the detection beam $OPT_{DET}$ and generate an electric signal, demonstrated in the example of FIG. 2 as a voltage $V_{DET}$ that corresponds to the intensity of the detection beam $OPT_{DET}$. The detection processor 74 can thus calculate the characteristics of the external signal based on the voltage $V_{DET}$, and thus based on the intensity of the detection beam $OPT_{DET}$ corresponding to the changes in absorption of the probe beam $OPT_{PRB}$ by the alkali metal vapor resulting from the external signal and the reference signals $REF_X$, $REF_Y$, and $REF_Z$.

For example, the detection beam $OPT_{DET}$ can have an intensity that can change based on the external signal and based on the predetermined frequency of the reference signals $REF_X$, $REF_Y$, and $REF_Z$ along the respective orthogonal axes. Therefore, the detection processor 74 can combine the frequency components of the external signal with the frequency components of the reference signals $REF_X$, $REF_Y$, and $REF_Z$ along the respective orthogonal axes to monitor respective beat frequencies along the respective orthogonal axes. The beat frequencies can each correspond a difference between the frequency of the external signal along the respective one of the orthogonal axes and the predetermined frequency of the respective one of the reference signals $REF_X$, $REF_Y$, and $REF_Z$ associated with the same orthogonal axis. Therefore, the detection processor 74 can provide for a matrix solution of the frequency of the external signal, as well as the vector components of the external signal, based on an analysis of the beat frequencies and based on the known predetermined frequencies of the reference signals $REF_X$, $REF_Y$, and $REF_Z$.

For example, the combined electric field, $E_{LO}$, provided by the reference signals $REF_X$, $REF_Y$, and $REF_Z$ can be expressed as follows:

$$\vec{E}_{LO} = E_1 \cos(2\pi f_1 t)\hat{x} + E_2 \cos(2\pi f_2 t)\hat{y} + E_3 \cos(2\pi f_3 t)\hat{z} \quad \text{Equation 2}$$

Where:
$\hat{x}$ is the unit vector along the X-axis;
$\hat{y}$ is the unit vector along the Y-axis; and
$\hat{z}$ is the unit vector along the Z-axis.

The external field, $E_{ext}$, has an unknown amplitude, an unknown frequency, and unknown polarization components, and can be expressed as follows:

$$\hat{E}_{ext} = E_x \cos(2\pi f_{ext} t)\hat{x} + E_y \cos(2\pi f_{ext} t)\hat{y} + E_z \cos(2\pi f_{ext} t)\hat{z} \quad \text{Equation 3}$$

Therefore, the external signals will interfere with the reference signals $REF_X$, $REF_Y$, and $REF_Z$ at the measurement point, giving a power measurement on the photodiode 72 that is proportional to $|E_{LO}+E_{ext}|^2$, which can be expressed as follows:

$$|\vec{E}_{LO} + \vec{E}_{ext}|^2 = \quad \text{Equation 4}$$

$$E_{LO}^2 + E_{ext}^2 + E_1^2 \cos(4\pi f_1 t) +$$

$$\frac{E_2^2 \cos(4\pi f_2 t) + E_3^2 \cos(4\pi f_3 t) + E_{ext}^2 \cos(4\pi f_{ext} t)}{2} +$$

$$E_1 E_x \cos(2\pi (f_1 - f_{ext})t)^2 + E_1 E_x \cos(2\pi (f_1 - f_{ext})t) +$$

$$E_2 E_y \cos(2\pi (f_2 - f_{ext})t)^2 + E_2 E_y \cos(2\pi (f_2 - f_{ext})t) +$$

$$E_3 E_z \cos(2\pi (f_3 - f_{ext})t)^2 + E_3 E_z \cos(2\pi (f_3 - f_{ext})t)$$

Where:
$f_1$ is the frequency of the reference signal $REF_X$;
$f_2$ is the frequency of the reference signal $REF_Y$;
$f_3$ is the frequency of the reference signal $REF_Z$;
$E_1$ is the amplitude of the reference signal $REF_X$;
$E_2$ is the amplitude of the reference signal $REF_Y$; and
$E_3$ is the amplitude of the reference signal $REF_Z$.

As an example, the alkali metal vapor only responds to a limited set of frequencies. Therefore, the limited detectable REF frequency range dictates that the DC and high frequency components of Equation 4 are intrinsically filtered out. Therefore, the frequency difference (subtractive) terms of Equation 4 correspond to the beat frequencies that are evaluated by the detection processor 74, while the remaining terms of Equation 4 can be disregarded by the detection processor 74. As a result, the electrometer system 50 does not need expensive and bulky filtering electronics that can be prone to interference from noise or jamming. Additionally, there is a discrete set of Rydberg transition frequencies that can govern the possible frequencies of the reference signals $REF_X$, $REF_Y$, and $REF_Z$. For each such Rydberg transition, the detectable frequency range of the external signal can be within approximately +/−10 MHz of the frequencies of the reference signals $REF_X$, $REF_Y$, and $REF_Z$, which can be limited by the electromagnetic induced transparency (EIT) pumping rate.

As a result, the detection processor 74 can evaluate the beat frequencies associated with the predetermined frequency of the reference signals $REF_X$, $REF_Y$, and $REF_Z$ along the respective orthogonal vector components to solve for the amplitude, frequency, and vector components of the external signal in three-dimensional space. Accordingly, the electrometer system 50 can implement REF signal detection to determine amplitude, frequency, and direction of an external signal. Because the electrometer system 50 is implemented without an array of antennas that are polarized along multiple directions, the electrometer system 50 can be implemented in a much more compact volume than typical electrometers, such as to provide for a more compact and lighter form-factor.

As described herein, the electrometer system 50 is also configured to operate as a tensor sensor with respect to the external signal. Therefore, the electrometer system 50 can further be implemented to determine a source direction of the external signal, as well as to determine attenuation of the external signal in three-dimensional space within the sensor cell 52. As an example, the collimating optics 64 and 66 can be configured to provide a plurality of measurement axes associated with the probe beam $OPT_{PRB}$ and the coupling beam $OPT_{CPL}$ within the sensor cell 52. For example, the collimating optics 64 and 66 can provide for a static configuration of multiple measurement axes within the sensor cell 52, such as based on a series of mirrors and beamsplitters, to provide the multiple measurement axes, and thus multiple detection beams $OPT_{DET}$. As another example, the collimating optics 64 and 66 can dynamically move the measurement axis in two-dimensional space along a transverse cross-section of the sensor cell 52, such that the detection beam $OPT_{DET}$ can be monitored in a sequence corresponding to the different multiple measurement points. Furthermore, the collimating optics 64 and 66 can be provided such that the probe beam $OPT_{PRB}$ and the coupling beam $OPT_{CPL}$ can be provided along all three of orthogonal axes within the sensor cell 52 to provide for a three-dimensional tensor measurement of the external signal.

Figure 5:
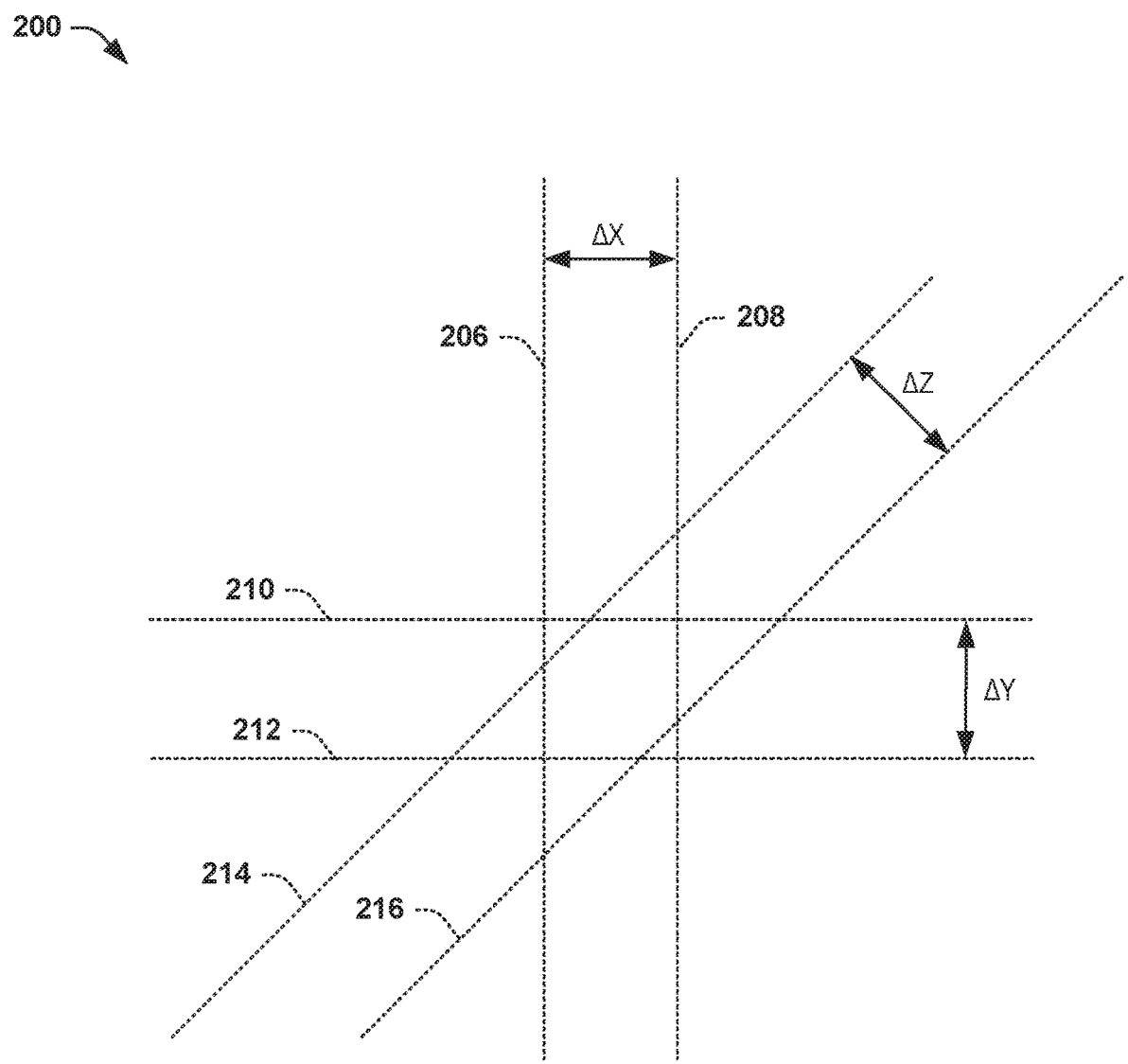
FIG. 5 illustrates an example diagram of tensor measurement of an external signal.

FIG. 5 illustrates an example diagram 200 of tensor measurement of an external signal. The diagram 200 demonstrates three sets of parallel measurement axes that can each correspond to an axis through which the collimated and collinear anti-parallel probe beam $OPT_{PRB}$ and coupling beam $OPT_{CPL}$ propagate. As a result, reference is to be made to the examples of FIG. 2 in the following description of the example of FIG. 5.

In the example of FIG. 5, the diagram 200 demonstrates a first measurement axis 206 and a second measurement axis 208 that are spaced apart along the X-axis by a predetermined distance $\Delta X$. Similarly, the diagram 200 demonstrates a third measurement axis 210 and a fourth measurement axis 212 that are spaced apart along the Y-axis by a predetermined distance $\Delta Y$. Furthermore, the diagram 200 demonstrates a fifth measurement axis 214 and a sixth measurement axis 216 that are spaced apart along the Z-axis by a predetermined distance $\Delta Z$. The distances $\Delta X$, $\Delta Y$, and $\Delta Z$ can be predetermined by the detection system 62. For example, as described previously, the measurement axes 206, 208, 210, 212, 214, and 216 can be established based on the collimating optics 64 and 66 providing the probe beam $OPT_{PRB}$ and the coupling beam $OPT_{CPL}$ in a predetermined manner.

As an example, the detection system 62 can monitor a detection beam $OPT_{DET}$ associated with each of the measurement axes 206, 208, 210, 212, 214, and 216, either concurrently or in a sequence. Therefore, the detection processor 74, in response to detecting an amplitude of the external signal at each of the measurement axes in a given pair, can determine an attenuation of the amplitude of the external signal along the respective one of the orthogonal axes. As a result, the detection processor 74 can determine a direction of the source of the external signal, as well as the attenuation of the external signal in three-dimensional space.

For example, the detection processor 74 can determine the amplitude of the external signal at the first measurement axis 206 and at the second measurement axis 208, and can determine an attenuation of the external signal along the X-axis based on the difference in amplitude of the external signal at the first and second measurement axes 206 and 208 based on the predetermined distance $\Delta X$. Similarly, the detection processor 74 can determine the amplitude of the external signal at the third measurement axis 210 and at the fourth measurement axis 212, and can determine an attenuation of the external signal along the Y-axis based on the difference in amplitude of the external signal at the third and fourth measurement axes 210 and 212 based on the predetermined distance $\Delta Y$. Additionally, the detection processor 74 can determine the amplitude of the external signal at the fifth measurement axis 214 and at the sixth measurement axis 216, and can determine an attenuation of the external signal along the Z-axis based on the difference in amplitude of the external signal at the fifth and sixth measurement axes 214 and 216 based on the predetermined distance $\Delta Z$. The electrometer system 50 can act as a tensor measurement sensor to determine an approximate location of the source of the external signal (e.g., distance and direction) based on the amplitude difference measurements between each of the pairs of measurement axes 206 and 208, 210 and 212, and 214 and 216.

Figure 6:
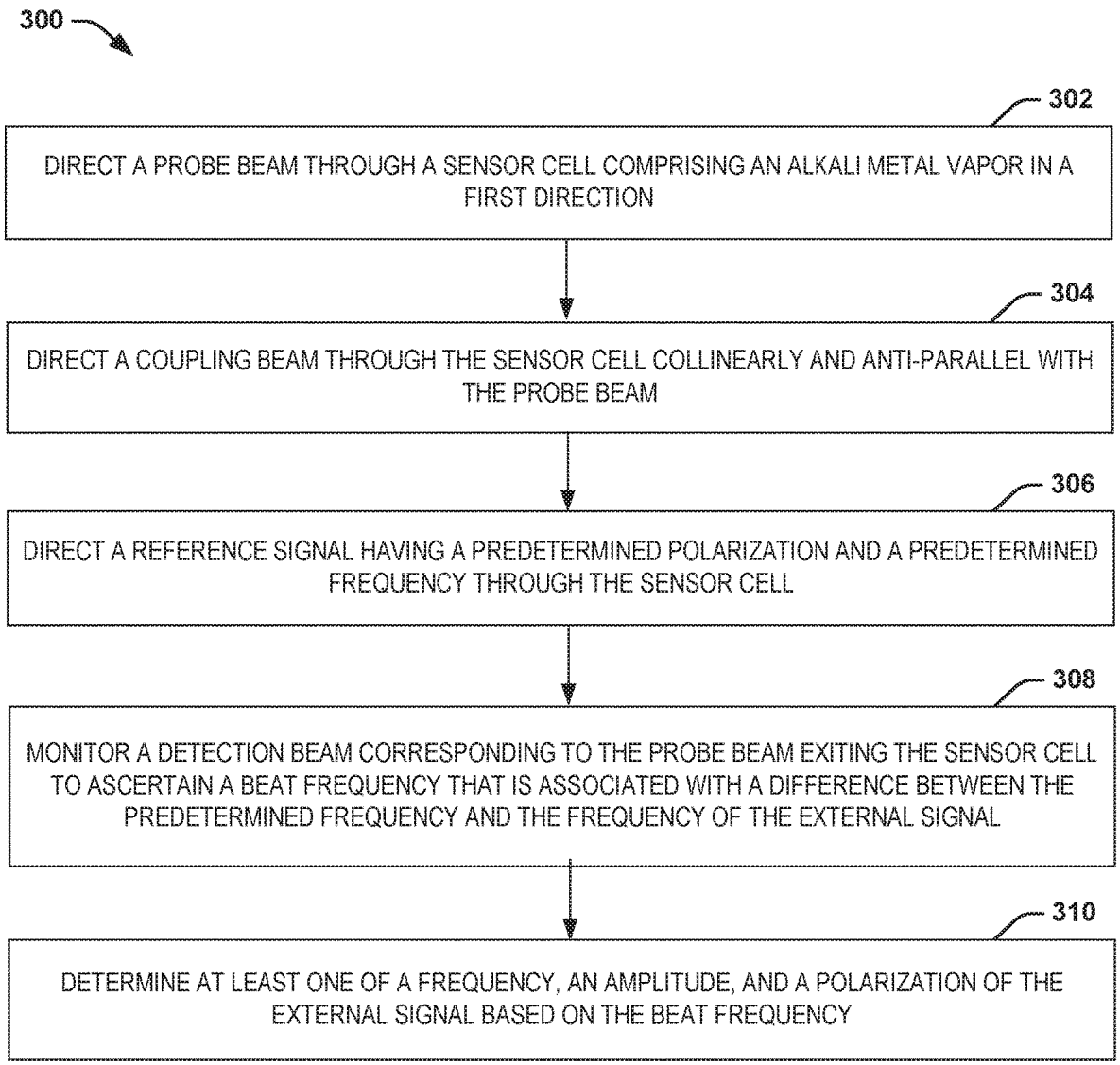
FIG. 6 illustrates an example of a method for detecting an external signal via an electrometer system.

In view of the foregoing structural and functional features described above, a methodology in accordance with various aspects of the disclosure will be better appreciated with reference to FIG. 6. It is to be understood and appreciated that the method of FIG. 6 is not limited by the illustrated order, as some aspects could, in accordance with the present disclosure, occur in different orders and/or concurrently with other aspects from that shown and described herein. Moreover, not all illustrated features may be required to implement a methodology in accordance with an aspect of the present examples.

FIG. 6 illustrates an example of a method 250 method for detecting an external signal via an electrometer system. At 252, a probe beam (e.g., the probe beam $OPT_{PRB}$) is directed through a sensor cell (e.g., the sensor cell 12) comprising an alkali metal vapor in a first direction. At 254, a coupling beam (e.g., the coupling beam $OPT_{CPL}$) is directed through the sensor cell collinearly and anti-parallel with the probe beam. At 256, a reference signal (e.g., the reference signal REF) is directed having a predetermined polarization and a predetermined frequency through the sensor cell. At 258, a detection beam (e.g., the detection beam $OPT_{DET}$) corresponding to the probe beam exiting the sensor cell is monitored to ascertain a beat frequency that is associated with a difference between the predetermined frequency and the frequency of the external signal. At 210, at least one of a frequency, an amplitude, and a polarization of the external signal is determined based on the beat frequency.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. An electrometer system comprising:
   a sensor cell comprising an alkali metal vapor within;
   a probe laser configured to generate a probe beam having a first frequency and directed through the sensor cell in a first direction, the probe beam exiting the sensor cell as a detection beam;
   a coupling laser configured to generate a coupling beam having a second frequency different from the first frequency and directed through the sensor cell collinearly and anti-parallel with the probe beam;
   a reference signal generator configured to generate a reference signal comprising a radio frequency (RF) signal having a predetermined polarization and a predetermined frequency through the sensor cell; and
   a detection system configured to monitor the detection beam to determine signal characteristics of an external signal based on an intensity of the detection beam and based on the predetermined polarization and the predetermined frequency of the reference signal.

2. The system of claim 1, wherein the detection system is configured to monitor a beat frequency that is associated with a difference between the predetermined frequency and the frequency of the external signal to determine at least one of a frequency, an amplitude, a phase, and a vector component of the external signal.

3. The system of claim 1, wherein the reference signal is configured to generate a first reference signal having a first predetermined frequency and a first linear polarization along a first axis, a second reference signal having a second predetermined frequency and a second linear polarization along a second axis; and a third reference signal having a third predetermined frequency and a third linear polarization along a third axis, wherein the first, second, and third axes are orthogonal axes with respect to each other, wherein the detection system is configured to monitor the detection beam to determine a frequency and a vector component of the external signal based on the intensity of the detection beam and based on the first, second, and third predetermined frequencies and the first, second, and third linear polarizations of the respective first, second, and third reference signals.

4. The system of claim 3, wherein the detection system is configured to monitor a first beat frequency that is associated with a difference between the first predetermined frequency and the frequency of the external signal, a second beat frequency that is associated with a difference between the second predetermined frequency and the frequency of the external signal, and a third beat frequency that is associated with a difference between the third predetermined frequency and the frequency of the external signal to determine at least one of a frequency, an amplitude, and orthogonal vector components of the external signal.

5. The system of claim 1, further comprising optics configured to collimate the probe beam and the coupling beam to provide the probe beam and the coupling beam to be collinear and anti-parallel with respect to each other, such that the detection system is configured to monitor the detection beam along an axis through the sensor cell to determine a frequency and a vector component of the external signal.

6. The system of claim 5, wherein the optics is further configured to collimate each of the probe beam and the coupling beam in a plurality of measurement axes in three-dimensional space in the sensor cell to provide a respective plurality of detection beams, such that the detection system is configured to monitor each of the plurality of detection beams to determine the frequency and the vector component of the external signal at each of the respective plurality of measurement axes to provide a tensor measurement of the external signal along at least one vector component.

7. The system of claim 6, wherein the optics is configured to selectively move the axes of each of the probe beam and the coupling beam to provide the plurality of measurement axes.

8. The system of claim 6, wherein the plurality of measurement axes comprises a pair of measurement axes along each of three orthogonal axes to provide the tensor measurement of the external signal along each of the three orthogonal axes.

9. The system of claim 1, wherein the first frequency associated with the probe beam and the second frequency associated with the coupling beam are tuned to respective frequencies to provide a Rydberg transition of the alkali metal vapor.

10. The system of claim 9, further comprising a laser controller configured to selectively implement a calibration procedure in which the laser controller sweeps one of the first frequency and the second frequency from a first frequency amplitude to a second frequency amplitude to determine a peak absorption frequency corresponding to a peak absorption of photons of the one of the probe beam and the coupling beam by the alkali metal vapor via the detection system, and in which the laser controller sets a frequency amplitude of the one of the first frequency and the second frequency to approximately the peak absorption frequency and sets the other of the first frequency and the second frequency to a complementary frequency amplitude to provide the Rydberg transition of the alkali metal vapor.

11. A method for detecting an external signal via an electrometer system, the method comprising:
    directing a probe beam having a first frequency through a sensor cell comprising an alkali metal vapor in a first direction;
    directing a coupling beam having a second frequency different from the first frequency through the sensor cell collinearly and anti-parallel with the probe beam;
    directing a reference signal comprising a radio frequency (RF) signal having a predetermined polarization and a predetermined frequency through the sensor cell;
    monitoring a detection beam corresponding to the probe beam exiting the sensor cell to ascertain a beat frequency that is associated with a difference between the predetermined frequency and the frequency of the external signal; and
    determining at least one of a frequency, an amplitude, and a polarization of the external signal based on the beat frequency.

12. The method of claim 11, wherein directing the reference signal comprises:
    directing a first reference signal having a first predetermined frequency and a first linear polarization along a first axis through the sensor cell;
    directing a second reference signal having a second predetermined frequency and a second linear polarization along a second axis through the sensor cell; and
    directing a third reference signal having a third predetermined frequency and a third linear polarization along a third axis through the sensor cell;
    wherein monitoring the beat frequency comprises:
    monitoring a first beat frequency that is associated with a difference between the first predetermined frequency and the frequency of the external signal;
    monitoring a second beat frequency that is associated with a difference between the second predetermined frequency and the frequency of the external signal;
    monitoring a third beat frequency that is associated with a difference between the third predetermined frequency and the frequency of the external signal;
    wherein determining at least one of the frequency, the amplitude, and the polarization of the external signal comprises determining a vector of the external signal based on the first, second, and third beat frequencies.

13. The method of claim 11, wherein directing the probe beam and the coupling beam comprises directing the probe beam and the coupling beam to be collinear and anti-parallel with respect to each other and collimated along a measurement axis within the sensor cell.

14. The method of claim 13, further comprising collimating each of the probe beam and the coupling beam in a plurality of measurement axes in three-dimensional space in the sensor cell to provide a respective plurality of detection beams, wherein monitoring the detection beam comprises monitoring each of the plurality of detection beams to determine the frequency and the vector component of the external signal at each of the respective plurality of measurement axes to provide a tensor measurement of the external signal along at least one vector component.

15. The method of claim 11, further comprising:
sweeping one of the first frequency and the second frequency from a first frequency amplitude to a second frequency amplitude to determine a peak absorption frequency corresponding to a peak absorption of photons of the one of the probe beam and the coupling beam by the alkali metal vapor via the detection system;
setting a frequency amplitude of the one of the first frequency and the second frequency to approximately the peak absorption frequency; and
setting the other of the first frequency and the second frequency to a complementary frequency amplitude to provide the Rydberg transition of the alkali metal vapor to selectively calibrate the electrometer system.

16. An electrometer system comprising:
a sensor cell comprising an alkali metal vapor within;
a probe laser configured to generate a probe beam having a first frequency and directed through the sensor cell in a first direction, the probe beam exiting the sensor cell as a detection beam;
a coupling laser configured to generate a coupling beam having a second frequency different from the first frequency and directed through the sensor cell collinearly and anti-parallel with the probe beam;
optics configured to provide the probe beam and the coupling beam to be collinear and anti-parallel with respect to each other and to focus each of the probe beam and the coupling beam to a measurement point within the sensor cell;
a reference signal generator configured to generate a reference signal comprising a radio frequency (RF) signal having a predetermined polarization and a predetermined frequency through the sensor cell; and
a detection system configured to monitor the detection beam to determine signal characteristics of an external signal at the measurement point based on an intensity of the detection beam and based on the predetermined polarization and the predetermined frequency of the reference signal.

17. The system of claim 16, wherein the detection system is configured to monitor a beat frequency that is associated with a difference between the predetermined frequency and the frequency of the external signal to determine at least one of a frequency, an amplitude, a phase, and a vector component of the external signal.

18. The system of claim 16, wherein the reference signal is configured to generate a first reference signal having a first predetermined frequency and a first linear polarization along a first axis, a second reference signal having a second predetermined frequency and a second linear polarization along a second axis; and a third reference signal having a third predetermined frequency and a third linear polarization along a third axis, wherein the first, second, and third axes are orthogonal axes with respect to each other, wherein the detection system is configured to monitor the detection beam to determine the frequency and the vector component of the external signal based on the intensity of the detection beam and based on the first, second, and third predetermined frequencies and the first, second, and third linear polarizations of the respective first, second, and third reference signals.

19. The system of claim 16, wherein the optics is further configured to collimate each of the probe beam and the coupling beam in a plurality of measurement axes in three-dimensional space in the sensor cell to provide a respective plurality of detection beams, such that the detection system is configured to monitor each of the plurality of detection beams to determine a frequency and a vector component of the external signal at each of the respective plurality of measurement axes to provide a tensor measurement of the external signal along at least one vector component.

20. The system of claim 16, further comprising a laser controller configured to selectively implement a calibration procedure in which the laser controller sweeps one of the first frequency and the second frequency from a first frequency amplitude to a second frequency amplitude to determine a peak absorption frequency corresponding to a peak absorption of photons of the one of the probe beam and the coupling beam by the alkali metal vapor via the detection system, and in which the laser controller sets one of the first frequency and the second frequency to approximately the peak absorption frequency and sets a frequency of the other of the first frequency and the second frequency to a complementary frequency amplitude to provide a Rydberg transition of the alkali metal vapor.

* * * * *